(12) United States Patent
Aspelmeyer et al.

(10) Patent No.: US 10,559,936 B2
(45) Date of Patent: Feb. 11, 2020

(54) LASER ACTIVE MEDIUM AND PROCESS OF MANUFACTURING THE SAME

(71) Applicant: UNIVERSITAET WIEN, Vienna (AT)

(72) Inventors: Markus Aspelmeyer, Maria Enzersdorf (AT); Garrett Cole, Vienna (AT)

(73) Assignee: Universitaet Wien, Vienna (AT)

( * ) Notice: Subject to any disclaimer, the term of this patent is extended or adjusted under 35 U.S.C. 154(b) by 0 days.

(21) Appl. No.: 15/509,808

(22) PCT Filed: Aug. 28, 2015

(86) PCT No.: PCT/EP2015/069763
§ 371 (c)(1),
(2) Date: Mar. 8, 2017

(87) PCT Pub. No.: WO2016/037870
PCT Pub. Date: Mar. 17, 2016

(65) Prior Publication Data
US 2017/0256904 A1  Sep. 7, 2017

(30) Foreign Application Priority Data
Sep. 9, 2014  (EP) .................................. 14184072

(51) Int. Cl.
*H01S 3/06* (2006.01)
*H01S 5/02* (2006.01)
(Continued)

(52) U.S. Cl.
CPC .......... *H01S 3/0602* (2013.01); *H01S 3/0071* (2013.01); *H01S 3/025* (2013.01);
(Continued)

(58) Field of Classification Search
CPC .. H01S 3/0602; H01S 5/02484; H01S 5/0071; H01S 5/0215; H01S 3/0071;
(Continued)

(56) References Cited

U.S. PATENT DOCUMENTS 5,796,766 A    8/1998   Hargis et al.
6,963,592 B2   11/2005  Huonker et al.
(Continued)

FOREIGN PATENT DOCUMENTS

CN    102684072 A    9/2012
JP    H0799360 A     4/1995
(Continued)

OTHER PUBLICATIONS

European Patent Office, Office Action Issued in Application No. 14184072.8, dated Aug. 21, 2017, Germany, 8 pages.
(Continued)

*Primary Examiner* — Yuanda Zhang
(74) *Attorney, Agent, or Firm* — McCoy Russell LLP

(57) ABSTRACT

A solid-state laser active medium comprising an optical gain material; a heat sink, wherein the heat sink is transparent, in particular over a wavelength range of 200 nm to 4000 nm, preferably with an absorption coefficient of <1 $cm^{-1}$; the heat sink having a high thermal conductivity, in particular ≥149 W/(m*K); wherein the optical gain material and the heat sink exhibit a root-mean square, RMS, surface roughness of <1 nm; wherein the optical gain material is attached to the transparent heat sink by direct bonding.

14 Claims, 7 Drawing Sheets

(51) Int. Cl.
| | |
|---|---|
| *H01S 5/022* | (2006.01) |
| *H01S 3/02* | (2006.01) |
| *H01S 3/04* | (2006.01) |
| *H01S 5/024* | (2006.01) |
| *H01S 3/00* | (2006.01) |
| *H01S 5/00* | (2006.01) |
| *H01S 3/094* | (2006.01) |
| *H01S 5/183* | (2006.01) |
| *H01S 5/14* | (2006.01) |

(52) U.S. Cl.
CPC .......... *H01S 3/0405* (2013.01); *H01S 3/0604* (2013.01); *H01S 5/0071* (2013.01); *H01S 5/0215* (2013.01); *H01S 5/02236* (2013.01); *H01S 5/02469* (2013.01); *H01S 5/02476* (2013.01); *H01S 5/02484* (2013.01); *H01S 3/0612* (2013.01); *H01S 3/0621* (2013.01); *H01S 3/094038* (2013.01); *H01S 5/0217* (2013.01); *H01S 5/14* (2013.01); *H01S 5/183* (2013.01)

(58) Field of Classification Search
CPC .. H01S 3/025; H01S 5/02236; H01S 5/02469; H01S 3/0405
See application file for complete search history.

(56) References Cited

U.S. PATENT DOCUMENTS

| | | | | |
|---|---|---|---|---|
| 2004/0099410 | A1* | 5/2004 | Ghosh | ................ H01L 23/3735 165/185 |
| 2005/0074041 | A1 | 4/2005 | Sommerer et al. | |
| 2005/0190810 | A1 | 9/2005 | Butterworth et al. | |
| 2008/0291948 | A1* | 11/2008 | McCarthy | ............... H01S 3/025 372/10 |
| 2008/0298407 | A1 | 12/2008 | Ikesue | |
| 2014/0376581 | A1* | 12/2014 | Stolzenburg | .............. H01S 3/04 372/36 |

FOREIGN PATENT DOCUMENTS

| | | |
|---|---|---|
| JP | H114030 A | 1/1999 |
| JP | 2013517631 A | 5/2013 |
| WO | 2006020925 A2 | 2/2006 |

OTHER PUBLICATIONS

European Patent Office, Extended European Search Report Issued in Application No. 14184072.8, dated Feb. 27, 2015, Germany, 9 pages.

ISA European Patent Office, International Search Report Issued in Application No. PCT/EP2015/069763, dated Jan. 29, 2016, WIPO, 3 pages.

Japan Patent Office, Office Action Issued in Application No. 2017-513083, dated Mar. 20, 2018, 11 pages. (Submitted with English Translation).

State Intellectual Property Office of the People's Republic of China, Office Action and Search Report Issued in Application No. 201580060443.2, dated Nov. 1, 2018, 18 pages. (Submitted with Partial Translation).

* cited by examiner

LASER ACTIVE MEDIUM AND PROCESS OF MANUFACTURING THE SAME

CROSS-REFERENCE TO RELATED APPLICATIONS

The present application is a U.S. National Phase of International Patent Application Serial No. PCT/EP2015/069763 entitled "LASER ACTIVE MEDIUM AND PROCESS OF MANUFACTURING THE SAME," filed on Aug. 28, 2015. International Patent Application Serial No. PCT/EP2015/069763 claims priority to European Patent Application No. 14184072.8, filed on Sep. 9, 2014. The entire contents of each of the above-referenced applications are hereby incorporated by reference for all purposes.

FIELD OF THE INVENTION

The present invention relates to a laser active medium for a solid-state laser system and a process of manufacturing said laser active medium.

BACKGROUND OF THE INVENTION

Solid-state laser systems are known in the art. Such systems comprise a laser that uses a gain medium in the solid-state, rather than a liquid such as in dye lasers, or a gas as in gas lasers. The gain media of such lasers often involve semiconductor-based active materials comprising a high reflectivity multilayer stack monolithically integrated with a gain medium or a doped laser crystal capped with a sputtered oxide dielectric mirror. This "active mirror" as we will refer to it, is then mounted on or connected to a rigid substrate for structural support and cooling. U.S. Pat. No. 6,963,592 B2 discloses connecting a lasing medium to a cooling member or support by means of an adhesive layer, which is produced from an adhesive material transitioning from a liquid state into a cross-linked state with a minimum change in volume. However, the use of an adhesive layer, though straightforward in its implementation, may ultimately limit the thermal conductivity of the system. In addition, there may be problems with mechanical stability when adhesively joining the lasing medium to the cooling member. Moreover, the use of adhesive layers may limit the optical properties of the system. If metal-bonded structures are employed, the mounted structure will be rendered opaque on the cooling member side, thereby limiting possible directions for light extraction, or conversely for the input of an optical pump beam as adhesive, i.e. glue-based structures, may further exhibit a significant amount of optical absorption.

SUMMARY OF THE INVENTION

The present invention provides an alternative solution to overcome the above-mentioned limitations and provides a solid-state laser active medium with enhanced optical, thermal, and mechanical properties.

Within the context of this invention, the term optical gain material should be understood as a material capable of generating optical gain, wherein is understood that optical gain describes the optical amplification process in the material.

The invention provides a laser active medium for a solid-state laser system comprising: an optical gain material; a heat sink, wherein the heat sink is transparent, in particular over a wavelength range of 200 nm to 4000 nm, preferably with an absorption coefficient of <1 $cm^{-1}$; the heat sink having a high thermal conductivity, in particular greater than or equal to 149 W/m*K; wherein the optical gain material and the heat sink exhibit a root-mean square, RMS, surface roughness of <1 nm wherein the optical gain material is attached to the transparent heat sink by direct bonding.

A direct bonding process should be understood as joining of the optical gain material directly to the heat sink without any intermediate adhesive layers, such as glues or metallic solders. A heat sink may be understood as a heat spreader or a final carrier substrate or submount with a thermal conductivity greater than or equal to 149 W/m*K at room temperature. Typically, the heat sink may be planar, though there is also the possibility of using a curved structure with a predefined radius of curvature. Since the optical gain material is directly bonded to the heat sink, i.e. no intermediate layers are inserted and no materials such as adhesives, glues or glass frits are present, the thermal performance of the system is significantly improved. Therefore, the thermal performance is ultimately limited only by the thermal conductivities of the optical gain material or heat sink, whichever is lowest. Moreover, glue-based structures may melt, flow or plastically deform. This is avoided through the use of direct bonding, such that the overall mechanical properties of the laser are enhanced. In an optimized direct bonding process, interfacial bond strengths on the order of 1 $J/m^2$ are possible, approaching the bulk bond strength of a typical solid.

The direct bonding procedure is also advantageous as it allows for the realization of an optically transparent interface between the heat sink and gain material. With a transparent interface, it then becomes advantageous to employ a transparent carrier substrate as the heat sink. Coupled with direct bonding, a transparent heat sink offers the advantage of being able to extract light from both, i.e. all, sides of the structure, or conversely for pumping from both sides of the structure. Furthermore, employing a material with an optical absorption level below 1 $cm^{-1}$, allows for minimal heating of the assembly and nearly all of the light can be transmitted through the heat sink if so desired. Structures employing metal or glue for attachment may instead be either substantially opaque or may exhibit substantial absorption. Therefore, the overall geometry of the laser can be simplified and novel device designs may be explored using this invention.

For the purposes of this invention the optical gain material and heat sink must be polished, e.g. they must exhibit a root-mean square, RMS, surface roughness of <1 nm. This surface quality enables direct bonding following contact of the two surfaces.

The laser active medium may further comprise a high reflectivity thin-film stack, wherein the optical gain material may be combined with the high reflectivity thin-film stack.

The addition of a high reflectivity multilayer to the optical gain medium may allow for multi-pass pumping of the gain material, thereby enhancing the optical power output of the system and improving its overall efficiency. Furthermore, this design may allow for two of the laser components, e.g. gain material and one of the cavity end mirrors, to be combined into one hybrid element, thereby simplifying the system design and lowering production costs. It should be understood that the term "combine" refers to realization of direct, i.e. intimate contact, of the high-reflectivity multilayer with the optical gain material, either through direct deposition methods, with select examples being sputtering, evaporation, chemical vapor deposition, or even crystal growth techniques such as molecular beam epitaxy, as well as direct bonding techniques in which a separately deposited multilayer is transferred onto the gain material via a direct bonding process.

In the laser active medium as described above, the optical gain material may comprise a semiconductor structure or a doped laser crystal.

Depending on the ultimate application, a desired operating wavelength, power output, optical bandwidth, which may be particularly important for pulsed laser operation, will be chosen and drives whether a semiconductor-based or a doped crystal gain material may be employed.

In the laser active medium as described above, the semiconductor structure may be monolithic, combining a high reflectivity stack of alternating high and low index material and semiconductor-based optical gain material in one continuous structure.

A monolithic semiconductor structure should be understood as a continuous single element comprising a high reflectivity mirror stack and optical gain material. Similar to the advantages described above, the use of a monolithic semiconductor structure may allow for a simplified system design and lower costs, through a reduced component count. Furthermore, for a "dual band" reflector, the mirror may enable recycling or multiple passes of the optical pump beam and thus an enhancement in both output power and efficiency for a given pump power.

In the laser active medium as described above, the semiconductor-based optical gain material may comprise a semiconductor quantum structure.

In this case the use of semiconductor quantum electronic structures, e.g. quantum wells, wires, or dots, allow for enhanced optical gain as compared to structures using "bulk" semiconductor active material. This is enabled by enhanced overlap of the intra-cavity optical field with the gain material. Additional benefits are realized via the advantageous density of states for the recombining charge carriers near the electronic band edges, as well as the improved carrier confinement due to the larger bandgap of the surrounding barrier materials with respect to the isolated quantum structures.

In the laser active medium as described above, the active element may comprise a composite structure including a doped laser crystal combined with a multilayer stack of alternating high and low index materials yielding a high reflectivity mirror.

As described above, combining mirror and active material may yield a simpler system and also may allow for recycling of the pump light.

In the laser active medium as describe above, the doped laser crystal may comprise at least one of YAG doped with Nd, Yb, Er, Tm or combinations thereof; neodymium doped vanadates, neodymium doped tungstates, ytterbium doped tungstates, titanium doped sapphire, chromium doped $Al_2O_3$, chromium doped chalcogenides.

Depending on the final application, a desired operating wavelength, pump wavelength, output power, and optical gain bandwidth will drive the final choice of the laser material.

In the laser active medium as describe above, the direct bonding of the optical gain material to the transparent heat sink may comprise van der Waals forces bonding and/or preferably covalent bonding.

As opposed to adhesive or metallic, i.e. solder-based, attachment, direct bonding enables the potential for improved laser performance on a number of fronts: i) the laser may exhibit improved output power and efficiency via enhanced thermal conductivity at the interface between the optical gain material and heat sink; ii) direct bonding yields a transparent interface and, coupled with a transparent heat sink, reduces the overall optical absorption in the system and enables light transmission through the heat sink, e.g. for backside optical pumping, extraction of transmitted light, etc; and finally, iii) high strength, i.e. ~1 $J/m^2$ direct bonding may further improve the mechanical and structural characteristics of the laser gain medium when compared with solder or adhesive layers that may fail by melting or by plastic deformation under larger optical power loads.

In the laser active medium as described above, the heat sink may comprise a transparent and high thermal conductivity material, for example diamond, SiC, and AlN for visible and IR operation in a range of wavelengths from 200 nm to 4000 nm, or single-crystal silicon for near and mid-IR applications in a range of wavelengths from 1200-4000 nm.

As a direct-bonded interface has the potential for high thermal conductivity and optical transparency, it is advantageous to use a carrier substrate or heat sink material with high optical transparency, such as an absorption coefficient of less than 1 $cm^{-1}$ and a high thermal conductivity ≥149 W/m*K. Depending on the operating wavelength range and ultimate performance of the system a number of candidate materials including diamond, SiC, AlN, and single-crystal silicon are shown in Table 1.

| | transparency range | | thermal conductivity |
|---|---|---|---|
| | lower limit (nm) | upper limit (nm) | W/m * K |
| AlN | 200 | >4000 | 285 |
| Diamond | 225 | >20000 | >2000 |
| SiC (6H) | 410 | >1000 | ~500 |
| Silicon | 1200 | 6000 | 149 |

Table 1 shows the transparency range of candidate heat sink materials with lower limit and upper limit given in units of nm, as well as the thermal conductivity given in units of W/m*K.

The invention further provides a method for manufacturing a laser active medium for a solid-state laser system, the laser active medium comprising a semiconductor-based optical gain material, a heat sink, the heat sink having a high thermal conductivity, in particular greater than or equal to 149 W/m*K and being optically transparent preferably with an absorption coefficient of <1 $cm^{-1}$, in particular over a wavelength range of 200 nm to 4000 nm; the method comprising the steps of: providing the optical gain material, the optical gain material having a root-mean square, RMS, surface roughness of <1 nm; on a first substrate, in the case of a semiconductor-based optical gain material, wherein in particular the first substrate comprises GaAs, InP, GaN, AlN, Si, or Ge; providing the heat sink, the heat sink having a polished surface with a RMS roughness below 1 nm; detaching the semiconductor-based optical gain material from the first substrate; attaching the optical gain material to the heat sink by direct bonding.

The advantages of this method are the same as described above with respect to the laser active medium.

In the method as introduced above, the laser active medium may further comprise a high reflectivity thin-film stack, wherein the optical gain material may be combined with the high reflectivity thin-film stack; wherein the thin film stack may comprise a dielectric or semiconductor multilayer.

In the method as described above, a semiconductor-based laser gain material may be detached from the first substrate by using chemo-mechanical substrate removal or epitaxial lift-off processes.

The invention further provides a method for manufacturing a laser active medium for a solid-state laser system, the laser active medium based on a doped laser crystal, comprising the doped laser crystal as the optical gain material, a heat sink, wherein the heat sink exhibits high thermal conductivity, in particular ≥149 W/m*K and being optically transparent preferably with an absorption coefficient of <1 $cm^{-1}$, in particular over a wavelength range of 200 nm to 4000 nm; the method comprising the steps of: providing the doped laser crystal with a surface roughness below 1 nm RMS; providing the transparent heat sink with a surface roughness below 1 nm RMS; attaching the laser-crystal based gain material to the heat sink by direct bonding.

The advantages of this method are the same as described above with respect to the laser active medium.

In the method as introduced above, the doped-crystal-based laser active medium may further comprise a high reflectivity thin-film stack, wherein the optical gain material may be combined with the high reflectivity thin-film stack; wherein the thin film stack may comprise a dielectric or semiconductor multilayer.

In the method as described above, the optical gain material may be directly attached to the heat sink by van der Waals forces bonding and/or preferably covalent bonding.

Attaching the laser gain medium to the heat sink by van der Waals forces or preferably covalent bonding avoids the use of any intermediate layers or materials such as glues, metal solders, thin-film adhesives, etc. Thus, any potentially weakening effects introduced by such materials, i.e. absorption, melting, or a reduced thermal contact etc. may be avoided.

In the method as described above, attaching the laser gain medium to the heat sink by bonding may be followed by annealing the bond in order to increase the achievable interfacial strength. The annealed, direct-bonded interface may become more rigid and show reduced deformation under large thermo-mechanical loads. The bond strength may thus even approach the strength of the bulk material, which may be limited by the weakest material employed in the bonded stack.

The invention further provides a solid-state laser system comprising: at least two mirrors for laser feedback; a laser active medium as described above; a pump light source proving a pump beam, the pump beam being incident on the laser active medium.

Thus a highly efficient solid-state laser system may be provided.

The above and other aspects, features and advantages of the present invention will become more apparent from the following detailed description when taken in conjunction with the accompanying drawings.

DETAILED DESCRIPTION

Figure 1:
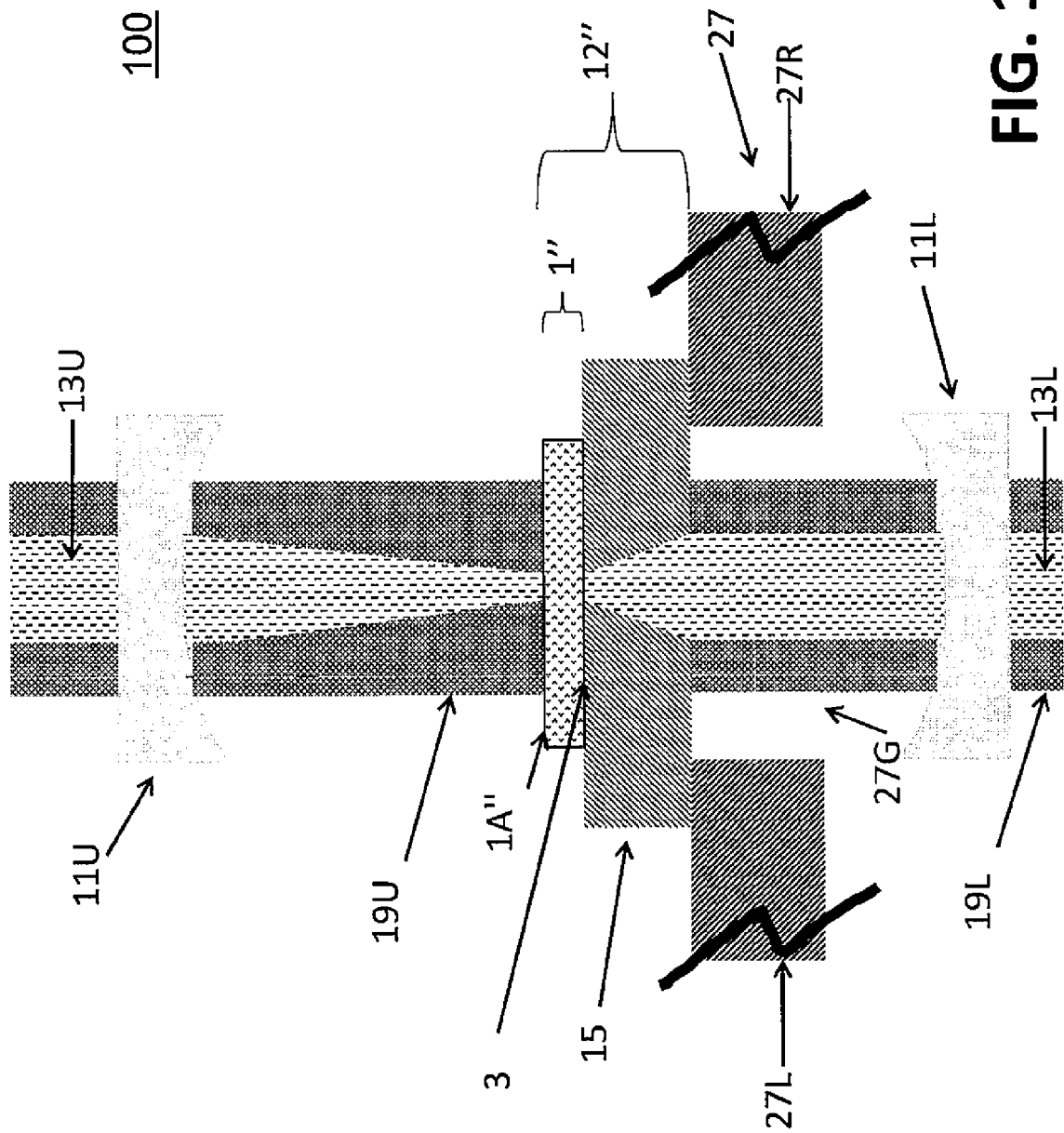
FIG. 1 shows a first embodiment of a laser active medium for a solid-state laser system according to the invention.

In the following it should be understood that the same reference numerals refer to the same elements.

FIG. 1 shows a first embodiment of a laser active medium 12" for a solid-state laser system 100.

The laser active medium 12" is shown as being part of the solid-state laser system 100. In FIG. 1 a pump beam 19U and 19L is shown, which may be produced by a pump light source. This pump beam 19U and 19L is incident substantially perpendicular, i.e. normal to the surface of the laser active medium 12".

In FIG. 1, the laser active medium 12" comprises the optical gain material 1" which comprises a doped laser crystal 1A". The doped laser crystal 1A" may comprise at least one of YAG doped with Nd, Yb, Er, Tm or combinations thereof; neodymium doped vanadates, neodymium doped tungstates, ytterbium doped tungstates, titanium doped sapphire, chromium doped $Al_2O_3$, chromium doped chalcogenides. It should be understood, that while this embodiment explicitly shows an optical gain material 1" comprising a doped laser crystal 1A", the optical gain material 1" may be substituted with optical gain material of FIG. 2-7. In other words, the optical gain material 1" can be substituted by a semiconductor-based optical gain material 1 and 1' as is discussed with regard to the other Figures.

The laser optical gain material 1" of the laser active medium 12" as shown in FIG. 1 is bonded onto a heat sink 15. This bond is a direct bond 3. A direct bonding process yielding a direct bond 3 should be understood as joining of the optical gain material 1" directly to the heat sink 15 without any intermediate adhesive layers, such as glues or metallic solders.

The heat sink 15 may be understood as a heat spreader or a final carrier substrate. It may also be realized in combination with a submount 27 as is shown in FIG. 1. The heat sink 15 typically has a thermal conductivity greater than or equal to 149 W/m*K at room temperature. The heat sink 15 may be planar. It may also be possible to use a heat sink having a curved structure with a predefined radius of curvature (not shown). Since the optical gain material 1, i.e. the active mirror, is directly bonded to the heat sink 15, i.e. no intermediate layers are inserted and no materials such as adhesives, glues, or glass frits are present, such that the thermal performance of the system is significantly improved. Therefore, the thermal performance of the laser active medium 12" is ultimately limited only by the thermal conductivities of the optical gain material 1" and/or heat sink 15, whichever is lowest. Moreover, glue-based structures may melt, flow or plastically deform. This is avoided through the use of direct bond 3, such that the overall mechanical properties of the laser system 100 may be enhanced. In an optimized direct bonding process, interfacial bond strengths on the order of 1 J/m$^2$ are possible, approaching the bulk bond strength of a typical solid.

In FIG. 1 the heat sink 15 may be transparent, in particular over a wavelength range of 200 nm to 4000 nm, preferably with an absorption coefficient of <1 cm$^{-1}$. In FIG. 1, to enable direct bonding, the optical gain material and the heat sink exhibit a root-mean square, RMS, surface roughness of <1 nm.

FIG. 1 shows a submount 27. Said submount 27 may be transparent having similar properties as the heat sink 15. As shown in FIG. 1, submount 27 may additionally or alternatively comprise at least two parts 27L and 27R. The two parts 27L and 27R may comprise substantially the same material. The at least two parts 27L and 27R of the submount 27 however may be not directly adjacently provided such that laser output light may also be emitted through a gap 27G between the two parts 27L and 27R.

In FIG. 1, laser output light 13U and 13L is emitted from the laser active medium 12". Laser output light 13U is emitted into the direction from which pump beam 19U is incident, i.e. substantially normal to the surface of the laser active medium 12". In addition, in FIG. 1, laser output light 13L may be emitted in a diametrically opposite direction than laser output light 13U. Here, the direct bond 3 of the optical gain material 1", bonded to the transparent heat sink 15, may reduce the overall optical absorption of the laser active medium 12 and thus of the laser system 100, and in particular enables light transmission through the heat sink 15, as well as through the submount 27 or through the gap 27G in between the two parts of the submount 27L and 27R.

FIG. 1 also shows two external mirrors 11U and 11L for focusing the laser output light 13U and 13L, respectively and more importantly for providing optical feedback for the laser cavity. External mirrors 11U and 11L may be substantially concave mirrors, having their optical axes aligned with the center axis normal to the laser active medium 12". That is, external mirror 11L focuses laser output light 13U which emerges through the heat sink 15 and the submount 27 or the gap 27G between submount parts 27L and 27R, respectively. External mirror 11L may be substantially the same as external mirror 11R. External mirrors 11L and 11R thus may be partially transparent only for substantially collinear laser light, reflecting back some portion of the laser output light onto the laser active medium 12".

Figure 2:
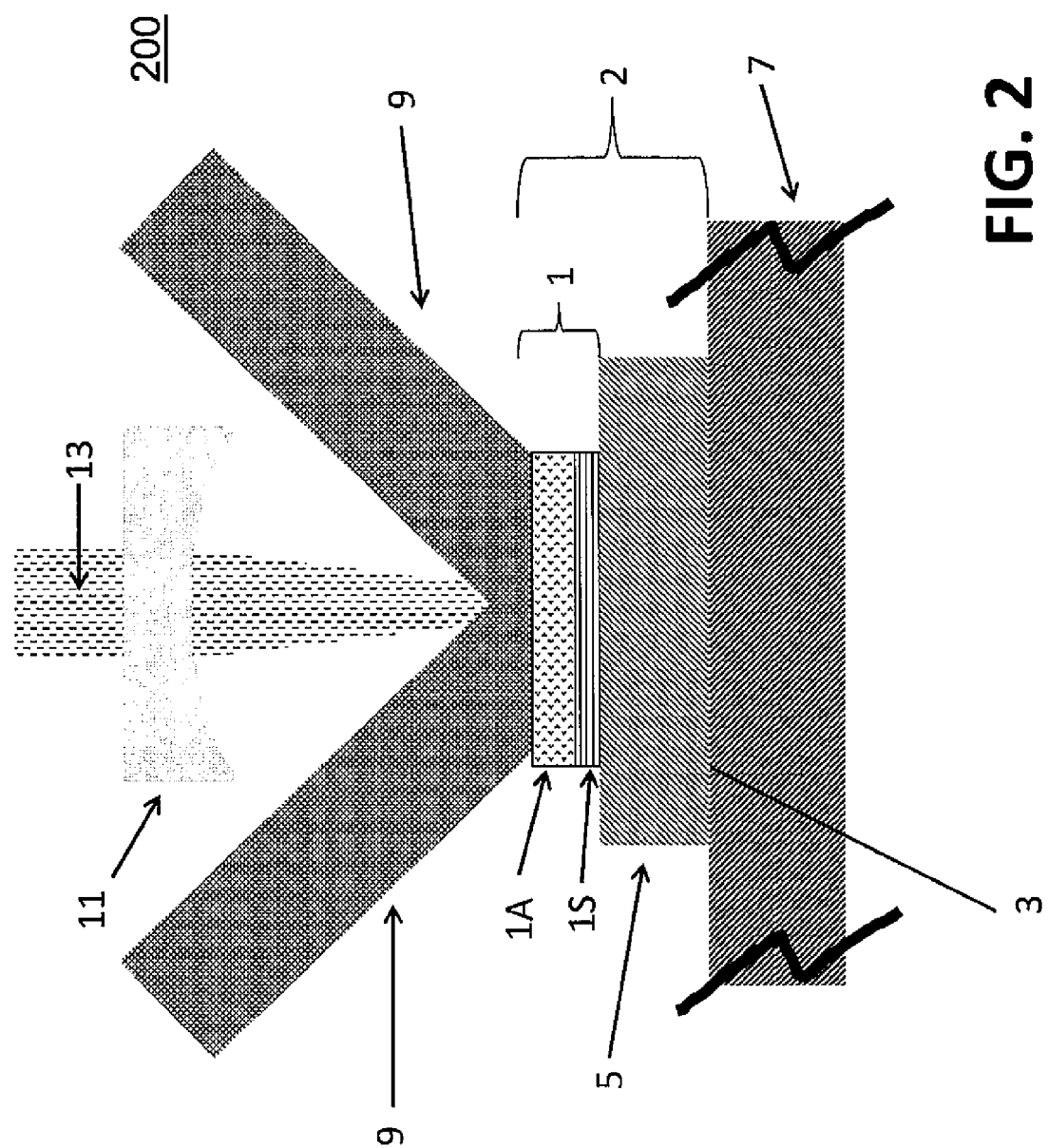
FIG. 2 shows a further embodiment of a laser active medium for a solid-state laser system according to the invention.

In FIG. 2, a further embodiment is shown according to the present invention. FIG. 2 shows a laser active medium 2 which is different from the laser active medium 12" as shown in FIG. 1.

FIG. 2 shows a laser active medium 2 for a solid-state laser system 200. The laser active medium 2 is shown as being part of the solid-state laser system 200. In FIG. 2 an off-axis pump beam 9, which may be a pump light source is shown. This pump beam 9 is incident on the laser active medium 2 at an angle, whereas the angle of incidence is different from 90°, i.e. the pump beam is not perpendicular to the surface of the laser active medium 2.

The laser active medium 2 comprises an optical gain material 1. The optical gain material 1 comprises a semiconductor structure 1A and a high reflectivity thin-film stack 1S. It is also understood that the optical gain material may comprise a doped laser crystal combined with a high reflectivity stack. In all embodiments shown in the FIGS. 1-7 either structure, i.e. semiconductor-based optical gain material or doped crystal based optical gain material is possible. The semiconductor structure 1A is combined with the high reflectivity thin-film stack 1S, thereby forming an active mirror. The term "combine" refers to realization of direct, i.e. intimate contact of the high reflectivity thin-film stack 1S which may be a high-reflectivity multilayer with the semiconductor structure 1A of optical gain material 1. This may be achieved either by direct deposition methods, with select examples being sputtering, evaporation, chemical vapor deposition, or even crystal growth techniques such as molecular beam epitaxy, as well as direct bonding techniques in which a separately deposited multilayer is transferred onto the gain material via a direct bonding process. The semiconductor structure 1A may be monolithic, combining the high reflectivity stack 1S, which may be a high-reflectivity stack of alternating high and low index material and semiconductor-based optical gain structure 1A in one continuous structure representing the laser optical gain material 1.

In FIG. 2, one side of the laser optical gain material 1 corresponds to the semiconductor structure 1A, the other side corresponds to the high reflectivity stack 1S.

The laser optical gain material 1 of the laser active medium 2 as shown in FIG. 2 is bonded onto a heat sink 5. This bond is a direct bond 3.

A direct bonding process should be understood as joining of the optical gain material 1 directly to the heat sink 5 without any intermediate adhesive layers, such as glues or metallic solders. As in FIG. 1, the heat sink 5 may comprise the same material as the heat sink 15 discussed with regard to FIG. 1. The heat sink 5 may be understood as a heat spreader or a final carrier substrate. It may also be realized in combination with a submount 7 as shown in FIG. 2. The heat sink 5 typically has a thermal conductivity greater than or equal to 149 W/m*K at room temperature. The heat sink 5 may be planar. It may also be possible to use a heat sink having a curved structure with a predefined radius of curvature, though that is not shown here. Since the optical gain material 1, i.e. the active mirror, is directly bonded to the heat sink 5, i.e. no intermediate layers are inserted and no materials such as adhesives, glues or glass frits are present, such that the thermal performance of the system is significantly improved. Therefore, the thermal performance of the laser active medium 2 is ultimately limited only by the thermal conductivities of the optical gain material 1 or heat sink 5, whichever is lowest. Moreover, glue-based structures may melt, flow or plastically deform. This is avoided through the use of direct bond 3, such that the overall mechanical properties of the laser system 200 may be enhanced. In an optimized direct bonding process, interfacial bond strengths on the order of 1 J/m$^2$ are possible, approaching the bulk bond strength of a typical solid.

In FIG. 2 the heat sink 5 may be transparent, in particular over a wavelength range of 200 nm to 4000 nm, preferably with an absorption coefficient of <1 cm$^{-1}$. In FIG. 2, wherein the optical gain material and the heat sink exhibit a root-mean square, RMS, surface roughness of <1 nm.

FIG. 2 shows that the side of the laser optical gain material 1 that corresponds to the high reflectivity stack 1S, is the side with which the laser optical gain material is directly bonded to the heat sink 5 by direct bond 3. The heat sink 5 in FIG. 2 is further supported by a submount 7. The material of the submount 7 may be the same as that of submount 27, discussed with respect to FIG. 1. In particular, submount 7 may exhibit the same optical properties and parameters as the heat sink 5. It should be understood, however, that submount 7 may not be essential for the laser system 200 as shown in FIG. 2. The heat sink 5 may be attached to the submount 7 by conventional means.

FIG. 2 shows laser output 13 emerging from the laser optical gain material 1. The laser output 13 emerges substantially to the top side, i.e. the surface of the optical gain material 1, i.e. the active mirror. This is the side of the optical gain material 1, on which the semiconductor structure or doped laser crystal 1A is located. FIG. 2 shows an additional external mirror 11 for partly reflecting laser output light 13. The external mirror 11 may be substantially the same as external mirrors 11U and 11L discussed with respect to FIG. 1. External mirror 11 will be partially transparent only for substantially collinear laser light, reflecting back laser output light onto the laser active medium 2. The center axis of the collinear laser output light 13 is typically aligned with the center axis of the laser optical gain material 1 and the heat sink 5, and typically also the center axis or the center of the submount 7.

Figure 3:
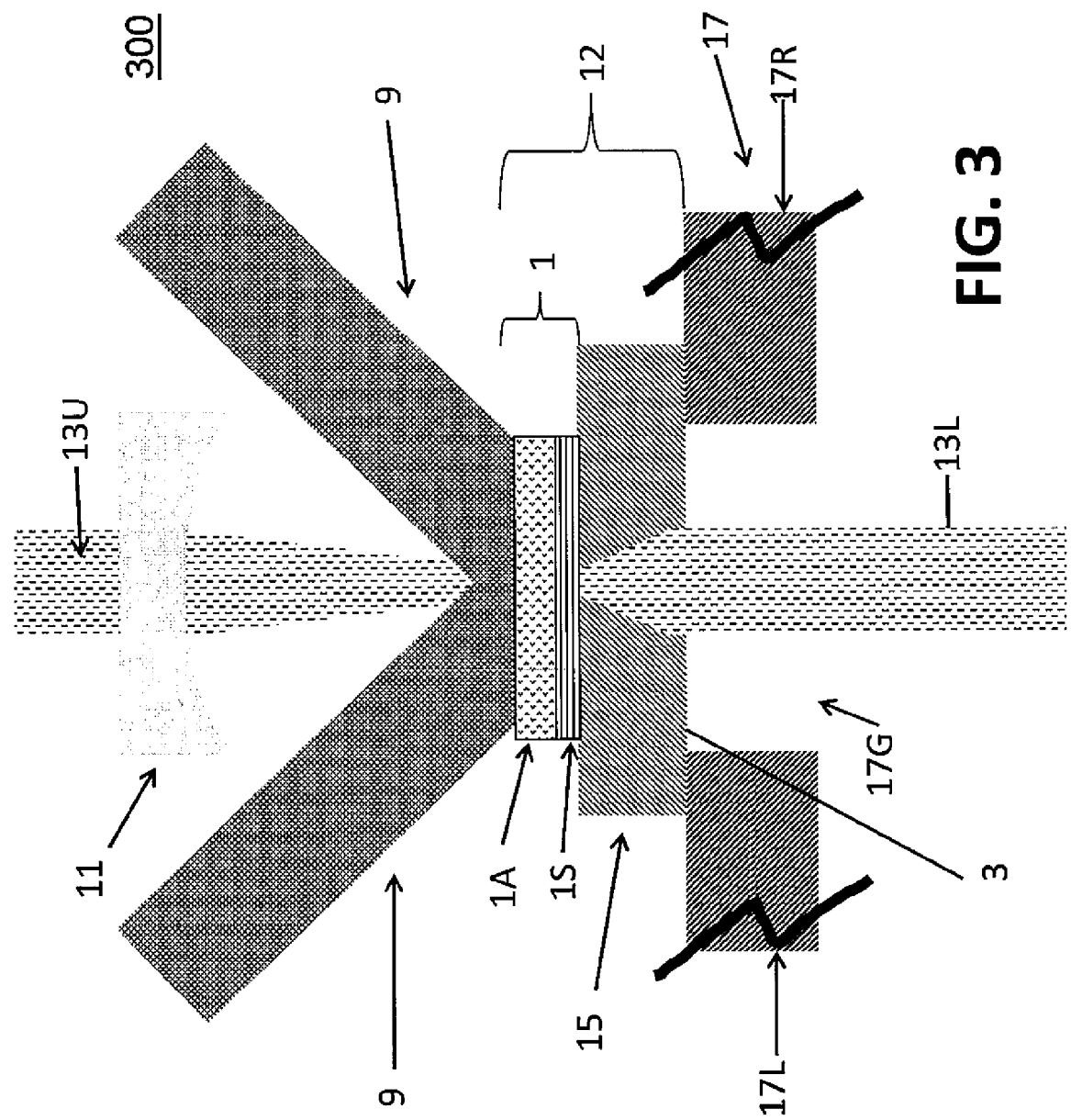
FIG. 3 shows a modification of the laser active medium for a solid-state laser system of FIG. 2.

FIG. 3 shows a further embodiment with a laser active medium 12 for a solid-state laser system 300. In FIG. 3, as in FIG. 2, an off-axis pump beam 9 is incident onto the laser active medium 12. The laser active medium 12 is similar to the laser active medium 2 as shown in FIG. 2. The laser active medium 12 is attached to an optically transparent heat sink 15. The heat sink 15 is optically transparent, in particular over a wavelength range of 200 nm to 4000 nm, preferably with an absorption coefficient of <1 cm$^{-1}$. In FIG. 3, wherein the optical gain material 1 and the heat sink 15 exhibit a root-mean square, RMS, surface roughness of <1 nm. The optical gain material 1 is attached to the heat sink 15 by direct bond 3, which is the same as shown in FIG. 2. In FIG. 3, a submount 17 is shown which is optically transparent for laser light emitted from the laser active medium 12. The submount 17 as in FIG. 3 may comprise at least two parts 17L and 17R. The two parts 17L and 17R are similar to the submount 27L and 27R as shown in FIG. 1. The at least two parts 17L and 17R of the submount 17 are not directly adjacently provided such that laser output light may also be emitted through a gap 17 G between the two components 17L and 17R. The laser output light 13U is emitted similar as the laser output light 13 in FIG. 2. In addition, in FIG. 3, laser output light 13L may be emitted in a diametrically opposite direction than laser output light 13U. Thus, the direct bond 3 of the optical gain material 1, bonded to the transparent heat sink 15, may reduce the overall optical absorption of the laser active medium 12 and thus of the laser system 200, and in particular enables light transmission through the heat sink 15, as well as through the submount 17.

Figure 4:
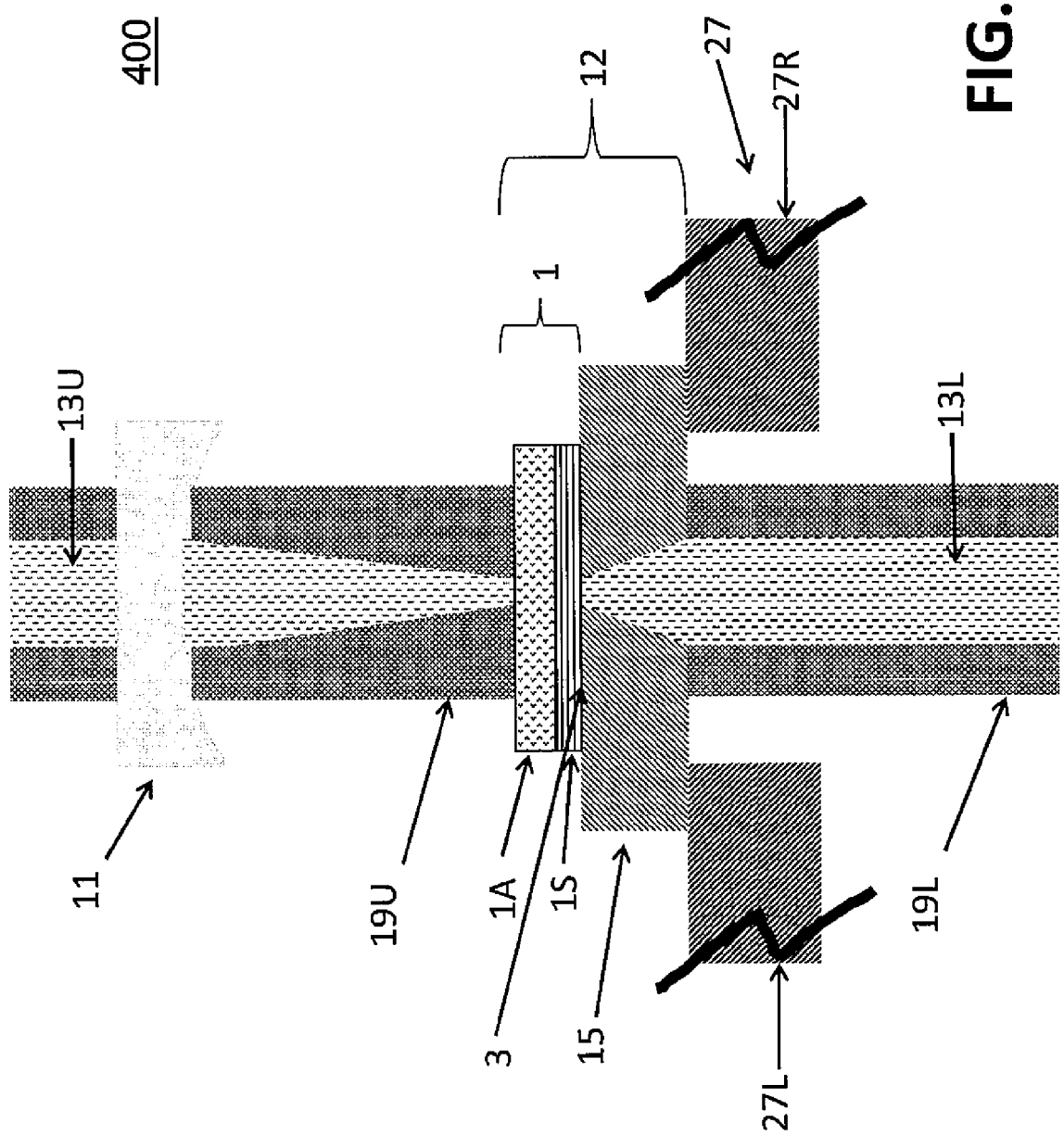
FIG. 4 shows a further embodiment of a laser active medium for a solid-state laser system according to the invention.

FIG. 4 shows the laser active medium 12 as shown in FIG. 3 for modified solid-state laser system 400. The setup as shown in FIG. 4 is similar to the setup shown in FIG. 3. In the solid-state laser system 300, however, a collinear pump beam 19U and 19L is shown instead of an off-axis beam 9. Thus the pump beam 19U and 19L is similar to the pump beam 19U and 19L as in FIG. 1. The collinear pump beam 19U and 19L is directly incident onto the laser active medium 12, as well as through a submount 27, which may be substantially similar to the submount 27 as shown in FIG. 1. The laser output light 13U and 13L thus is emitted collinearly to the incident pump beam 19U and 19L.

Figure 5:
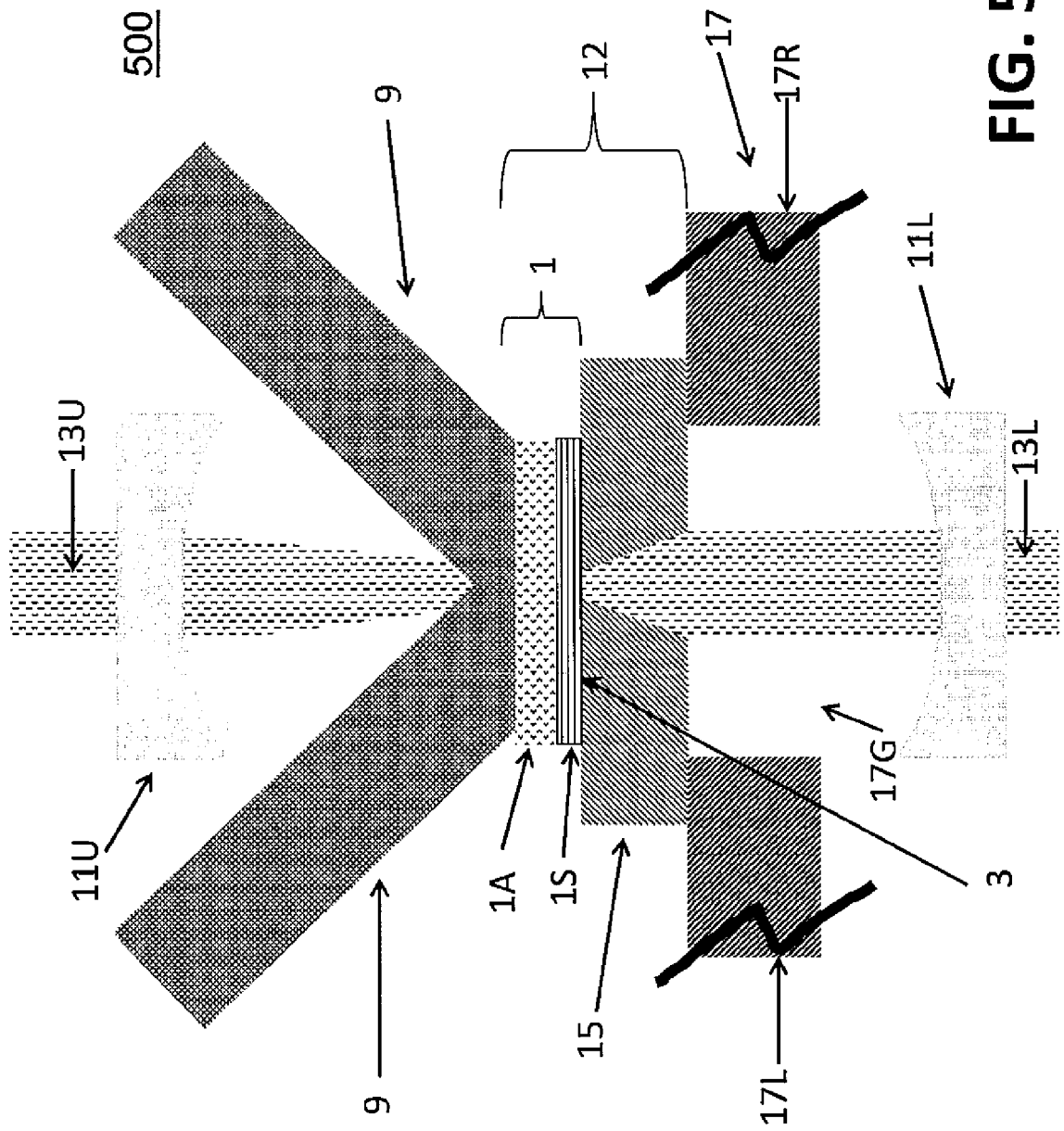
FIG. 5 shows a further embodiment of a laser active medium for a solid-state laser system according to the invention.

FIG. 5 shows the laser active medium 12 as shown in FIG. 3 and FIG. 4 for a further modified solid-state laser system 500.

FIG. 5 shows a similar set of externals mirrors 11U and 11L as in FIG. 1. As already discussed for FIG. 1, the optical gain material 1" as shown in FIG. 1 is replace by an optical gain material 12 as shown in FIGS. 2 and 3.

Figure 6:
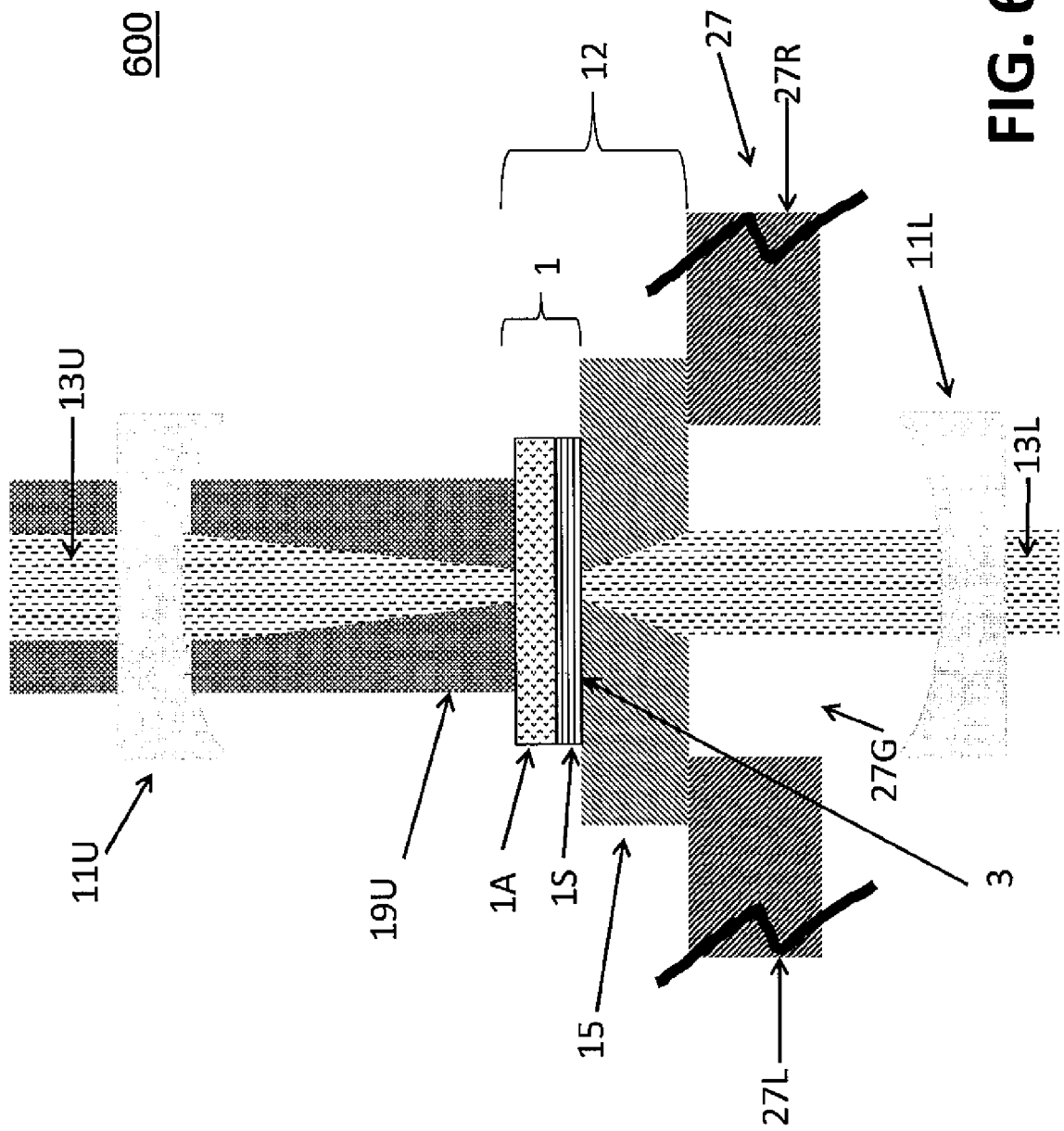
FIG. 6 shows a further embodiment of a laser active medium for a solid-state laser system according to the invention.

FIG. 6 shows the laser active medium 12 as shown in FIG. 3 and FIG. 4 and FIG. 5 for further modified solid-state laser system 600.

Figure 7:
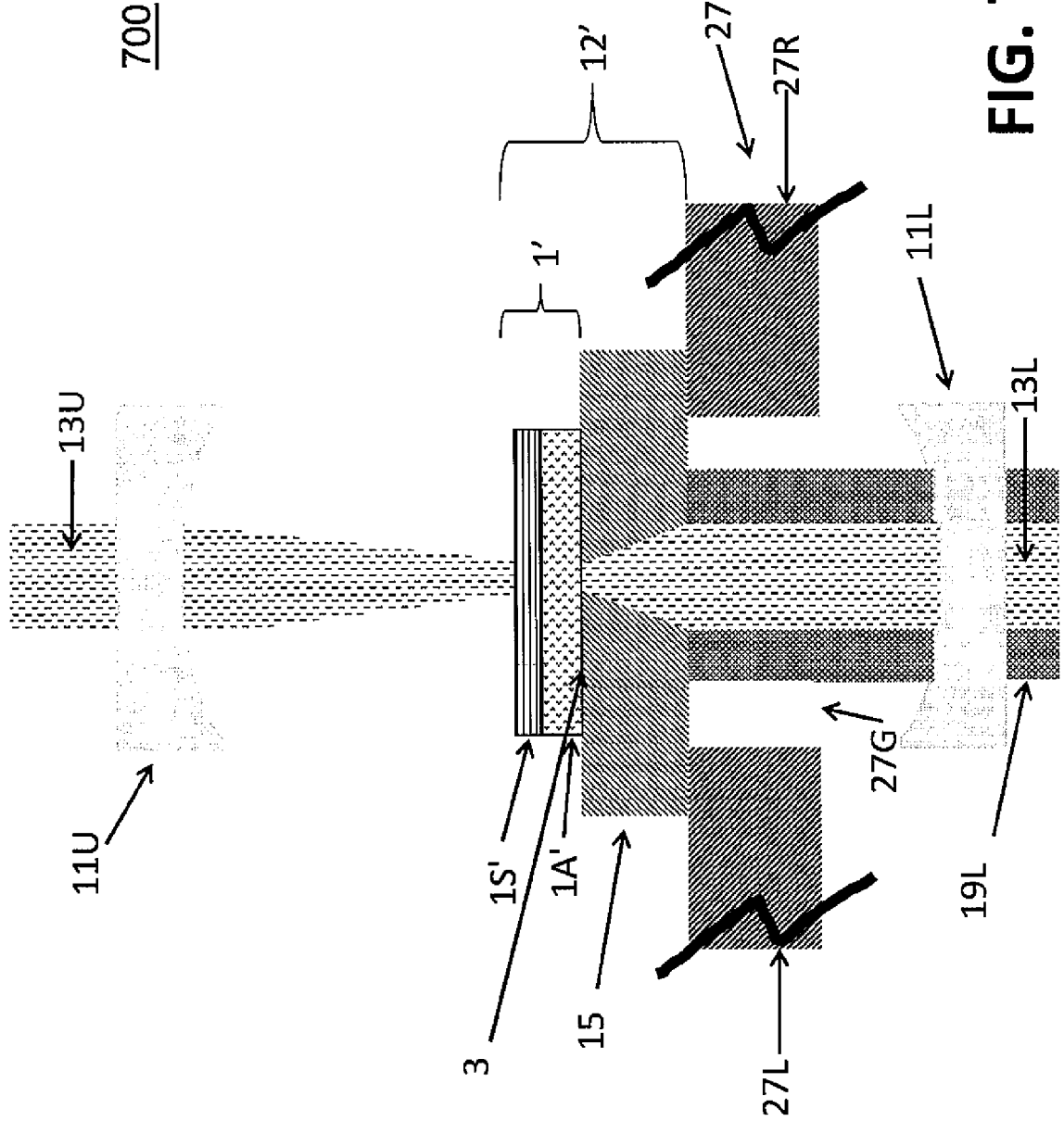
FIG. 7 shows a further embodiment of a laser active medium for a solid-state laser system according to the invention.

FIG. 7 shows a further embodiment of a laser active medium 12' for a solid-state laser system 700.

In FIGS. 6 and 7, the same setup of a solid-state laser system is shown as in FIG. 5. However, collinear pump beam 19U and 19L as shown in FIG. 5 are only incident from one side of the structure. That is, in FIG. 6, the collinear pump beam 19U is incident directly onto the laser gain medium 12. No collinear pump beam is passing the transparent heat sink 15 and or the submount 27. On the other hand, in FIG. 7, the opposite scenario is shown. Pump beam 19L is incident onto the laser gain medium 12 by passing through a gap 27G of the submount 27, and then, typically immediately afterwards, passing through heat sink 15. Furthermore, in FIG. 7, a laser active medium 12' is shown in which the sequence of an optical gain material 1' and a high reflectivity thin-film stack 1S' is reversed as compared to the other embodiments. In these structures the thin film stack 1S and 1S' are substantially highly reflective for the incident pump light.

The invention claimed is:

1. A method for manufacturing a solid state laser system comprising at least two mirrors for laser feedback, a laser active medium comprising a semiconductor-based optical gain material, a heat sink, the heat sink having a high thermal conductivity within a threshold, and being optically transparent within a threshold;

the method comprising the steps of:
providing the semiconductor-based optical gain material, the optical gain material having a root-mean square surface roughness of <1 nm, on a first substrate, wherein the first substrate comprises GaAs, InP, GaN, AlN, Si, or Ge;
providing the heat sink, the heat sink having a polished surface with a root-mean square roughness below 1 nm;
providing a submount, the submount supporting the heat sink, the submount having the same optical parameters as the heat sink;
detaching the optical gain material from the first substrate; and
attaching the optical gain material to the heat sink by direct bonding;
wherein the laser active medium further comprises a high-reflectivity thin-film stack, wherein the optical gain material is directly attached to the heat sink by covalent bonding;
wherein the optical gain material comprises at least one selected from the group of a semiconductor multi-quantum well, quantum dot, or bulk gain region; and
wherein the semi-conductor based optical gain material is directly bonded to the high-reflectivity thin-film stack of alternating high and low index materials yielding a first of the at least two mirrors, the first mirror being a high-reflectivity mirror;
providing a pump light source for providing a pump beam, the pump beam being incident on the laser active medium;
providing a second of the at least two mirrors, wherein the second mirror is an external mirror; and wherein the second mirror is a concave mirror having an optical axis aligned with a center axis normal to the laser active medium.

2. The method according to claim 1, wherein the heat sink is optically transparent over a wavelength range of 200 nm to 4000 nm, and wherein the heat sink thermal conductivity is greater than or equal to 149 W*m$^{-1}$*K$^{-1}$.

3. The method according to claim 2, wherein the heat sink has an absorption coefficient of <1 cm$^{-1}$.

4. A solid-state laser system, comprising:
at least two mirrors for laser feedback;
a laser active medium for a solid-state laser system, comprising:
an optical gain material;

a heat sink, wherein the heat sink is transparent within a threshold, and
wherein the heat sink has a high thermal conductivity within a threshold;
wherein the heat sink is supported by a submount, wherein the submount has the same optical parameters as the heat sink;
wherein the optical gain material and the heat sink exhibit a root-mean-square surface roughness of <1 nm;
wherein the optical gain material is attached to the transparent heat sink by direct bonding;
wherein the laser active medium further comprises a high-reflectivity thin-film stack,
wherein the direct bonding of the optical gain material to the transparent heat sink comprises covalent bonding;
wherein the optical gain material comprises a doped laser crystal;
wherein the doped laser crystal is directly bonded to the high-reflectivity thin-film stack of alternating high and low index materials yielding a first of the at least two mirrors, the first mirror being a high-reflectivity mirror; and
a pump light source providing a pump beam, the pump beam being incident on the laser active medium;
wherein a second of the at least two mirrors is an external mirror, wherein the external mirror is a concave mirror having an optical axis aligned with a center axis normal to the laser active medium.

5. The solid-state laser system according to claim 4, wherein the heat sink is transparent over a wavelength range of 200 nm to 4000 nm, and wherein the heat sink thermal conductivity is greater than or equal to 149 $W*m^{-1}*K^{-1}$.

6. The solid-state laser system according to claim 5, wherein the heat sink has an absorption coefficient of <1 $cm^{-1}$.

7. The solid state laser system of claim 4, wherein the doped laser crystal comprises at least one of YAG doped with Nd, Yb, Er, Tm, or combinations thereof; neodymium doped vanadates, neodymium doped tungstates, ytterbium doped tungstates, titanium doped sapphire, chromium doped $Al_2O_3$, and chromium doped chalcogenides.

8. The solid state laser system of claim 4, wherein the heat sink comprises a transparent and high thermal conductivity material including one of diamond, SiC, and AlN for visible and IR operation in a range of wavelengths from 200 nm to 4000 nm, or single-crystal silicon for near and mid-IR applications in a range of wavelengths from 1200-4000 nm.

9. A solid-state laser system comprising;
at least two mirrors for laser feedback;
a laser active medium for a solid-state laser system, comprising:
an optical gain material;
a heat sink, wherein the heat sink is transparent within a threshold, and wherein the heat sink has a high thermal conductivity within a threshold;
the heat sink being supported by a submount, wherein the submount has the same optical parameters as the heat sink;
wherein the optical gain material and the heat sink exhibit a root-mean-square surface roughness of <1 nm;
wherein the optical gain material is attached to the transparent heat sink by direct bonding;
wherein the laser active medium further comprises a high-reflectivity thin-film stack, wherein the direct bonding of the optical gain material to the transparent heat sink comprises covalent bonding;
wherein the optical gain material comprises at least one selected from the group of a semiconductor multi-quantum well, quantum dot, or bulk gain region; and
wherein the semi-conductor-based optical gain material is directly bonded to the high-reflectivity thin-film stack of alternating high and low index materials yielding a first of the at least two mirrors, the first mirror being a high-reflectivity mirror; and
a pump light source providing a pump beam, the pump beam being incident on the laser active medium;
a second of the at least two mirrors being an external mirror, the external mirror being a concave mirror and having an optical axis aligned with a center axis normal to the laser active medium.

10. The solid-state laser system of claim 9, wherein the heat sink is transparent over a wavelength range of 200 nm to 4000 nm, and wherein the heat sink thermal conductivity is greater than or equal to 149 $W*m^{-1}*K^{-1}$.

11. The solid-state laser system of claim 10, wherein the heat sink has an absorption coefficient of <1 $cm^{-1}$.

12. A method for manufacturing a solid state laser system comprising at least two mirrors for laser feedback, a laser active medium comprising a doped laser crystal, a heat sink, the heat sink having a high thermal conductivity within a threshold, and being optically transparent within a threshold;
the method comprising the steps of:
providing an optical gain material with a root-mean-square surface roughness of <1 nm;
providing the heat sink, the heat sink having a polished surface with a root-mean-square roughness below 1 nm;
providing a submount, the submount supporting the heat sink, the submount having the same optical parameters as the heat sink;
attaching the optical gain material to the heat sink by direct bonding;
wherein the laser active medium further comprises a high-reflectivity thin-film stack, wherein the optical gain material is directly attached to the heat sink by covalent bonding;
wherein the optical gain material comprises the doped laser crystal; and
wherein the optical gain material is directly bonded to the high-reflectivity thin-film stack of alternating high and low index materials yielding a first of the at least two mirrors, wherein the first mirror is a high-reflectivity mirror; and
providing a pump light source for providing a pump beam, the pump beam being incident on the laser active medium;
providing a second of the at least two mirrors being an external mirror, wherein the second mirror is a concave mirror having an optical axis aligned with a center axis normal to the laser active medium.

13. The method according to claim 12, wherein the heat sink is optically transparent over a wavelength range of 200 nm to 4000 nm, and wherein the heat sink thermal conductivity is greater than or equal to 149 $W*m^{-1}*K^{-1}$.

14. The method according to claim 13, wherein the heat sink has an absorption coefficient of <1 $cm^{-1}$.

* * * * *